(12) United States Patent
Cui

(10) Patent No.: US 9,480,167 B2
(45) Date of Patent: Oct. 25, 2016

(54) DEVICE FOR AUTOMATICALLY CLEANING PRINTED CIRCUIT BOARD AND THE METHOD USING THE SAME

(71) Applicant: BEIJING BOE OPTOELECTRONICS TECHNOLOGY CO., LTD., Beijing (CN)

(72) Inventor: Hongwei Cui, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 495 days.

(21) Appl. No.: 13/984,620

(22) PCT Filed: Dec. 20, 2012

(86) PCT No.: PCT/CN2012/086982
§ 371 (c)(1),
(2) Date: Aug. 9, 2013

(87) PCT Pub. No.: WO2014/015630
PCT Pub. Date: Jan. 30, 2014

(65) Prior Publication Data
US 2014/0102487 A1 Apr. 17, 2014

(30) Foreign Application Priority Data
Jul. 27, 2012 (CN) .......................... 2012 1 0265077

(51) Int. Cl.
*B08B 3/00* (2006.01)
*H05K 3/26* (2006.01)
*B08B 1/00* (2006.01)
(52) U.S. Cl.
CPC .. *H05K 3/26* (2013.01); *B08B 1/00* (2013.01)

(58) Field of Classification Search
None
See application file for complete search history.

(56) References Cited

U.S. PATENT DOCUMENTS

2004/0244816 A1* 12/2004 Luo .......................... B08B 3/10
134/1
2005/0066522 A1 3/2005 Takata et al.

FOREIGN PATENT DOCUMENTS

CN 1601715 A 3/2005
CN 2788510 Y 6/2006
(Continued)

OTHER PUBLICATIONS

International Search Report mailed Sep. 5, 2013; PCT/CN2012/086982.
(Continued)

*Primary Examiner* — Binh X Tran
*Assistant Examiner* — David Cathey, Jr.
(74) *Attorney, Agent, or Firm* — Ladas & Parry LLP

(57) ABSTRACT

Disclosed are a device for automatically cleaning printed circuit board and a method using the same. The device includes: a printed circuit board (PCB) tray, a transferring unit, an elevator unit, a cleaning unit and a unloading deck; the elevator unit includes a horizontal part and a vertical part; when the elevator unit is descended to the lowest position, an upper surface of the transferring unit is at a same horizontal position with an upper surface of the horizontal part of the elevator unit; the elevator unit is located below the cleaning unit, and the unloading deck is located above the transferring unit. The invention can not only save manpower, but also achieve standardization of the cleaning process and improve working efficiency.

19 Claims, 2 Drawing Sheets

(56) References Cited

FOREIGN PATENT DOCUMENTS

| | | | |
|---|---|---|---|
| CN | 1835658 A | 9/2006 | |
| CN | 201562867 U | 8/2010 | |
| CN | 102172592 A | 9/2011 | |
| CN | 202192041 U | 4/2012 | |
| JP | 2006295112 A | * 10/2006 | ............... H05K 3/26 |

OTHER PUBLICATIONS

First Chinese Office Action dated Dec. 25, 2014; Appln. No. 201210265077.2.

International Preliminary Report on Patentability dated Jan. 27, 2015; PCT/CN2012/086982.

* cited by examiner

DEVICE FOR AUTOMATICALLY CLEANING PRINTED CIRCUIT BOARD AND THE METHOD USING THE SAME

TECHNICAL FIELD

Embodiments of present invention relate to a device for automatically cleaning printed circuit board (PCB) and a method using the same.

BACKGROUND

In the current outer lead bonding (OLB) technology for liquid crystal display module, it is required to attach an anisotropy conductive adhesive (ACF) film onto a printed circuit board (PCB). Due to the influence of attaching technological conditions, PCBs have to be cleaned firstly so as to ensure the attaching quality. The cleaning process can be as follows. Firstly, a PCB is placed in a PCB tray; the PCB is then cleaned with a dust-free fabric dripped with alcohol thereon; the cleaned PCB is put into an ACF attaching apparatus.

In a conventional technology, the PCB cleaning operations are all done manually, and therefore the operating staffs have heavy workload, and the cleaning effect is worse; furthermore, as to different operating staffs, the cleaning effects vary greatly, and therefore it's difficult to achieve standardization of the operations. Obviously, the method of cleaning PCBs manually is not only manpower-consuming, but also bad in its cleaning effect, thereby affecting the product quality.

SUMMARY

Embodiments of the present invention provide a device for automatically cleaning printed circuit board and the method using the same, which device can realize automatically cleaning of PCBs, thus not only saving manpower, but also achieving standardization of the cleaning process and improving work efficiency.

One aspect of present invention provides a device for automatically cleaning printed circuit board, comprising: a PCB tray, a transferring unit, an elevator unit, a cleaning unit and an unloading deck; the transferring unit is adapted to deliver the PCB tray to the elevator unit; the elevator unit is adapted to deliver the PCB tray to the cleaning unit; the cleaning unit is adapted for cleaning a PCB in the PCB tray; the unloading deck is adapted for carrying on the PCB tray loaded with the cleaned PCB; the elevator unit comprises a horizontal part and a vertical part; when the elevator unit is descended to the lowest position, an upper surface of the transferring unit is at a same horizontal position with an upper surface of the horizontal part of the elevator unit; the elevator unit is located below the cleaning unit, the unloading deck is located above the transferring unit.

As to the device, for example, the transferring unit is a conveyor belt.

As to the device, for example, a width of the conveyor belt is greater than a width of the PCB tray.

As to the device, for example, the elevator unit is an electrical lift.

As to the device, for example, the cleaning unit comprises: an electrical motor, a cylinder, a cleaning head, a cleaning solution supplying head as well as x-axis and y-axis guide rails; the electrical motor is provided on the x-axis and y-axis guide rails so as to control the movements of the cleaning head in x-axis and y-axis directions; the upper end of the cylinder is coupled with the lower end of the electrical motor so as to control vertical movement of the cleaning head; the cleaning head is provided at the lower end of the cylinder; the lower end of the cleaning solution supplying head communicates with the cleaning head.

As to the device, for example, the lower end of the cleaning head is further provided with cleaning fabric.

As to the device, for example, the cleaning fabric is dust-free fabric.

Further, the device may further comprise a mechanical hand arranged on the unloading deck.

As to the device, for example, the mechanical hand comprises: two arms, two/four retaining clips, two/four spring clamps and a sliding tray; the two arms are symmetrically arranged on both sides of the upper surface of the unloading deck, respectively; the two/four retaining clips are symmetrically provided on the two arms respectively, and the two/four spring clamps are symmetrically provided on the two arms respectively; the sliding tray is slidably connected with the arms.

Another aspect of present invention also provides a method for using the device for automatically cleaning printed circuit board, the method comprises: placing a PCB tray loaded with a PCB onto a transferring unit, and delivering the PCB tray to an elevator unit with the transferring unit; delivering the PCB tray carrying the PCB to a cleaning unit with the elevator unit; after cleaning, delivering the PCB tray to the unloading deck with a mechanical hand.

With the device for automatically cleaning printed circuit board and the method using the same provided in the embodiments of present invention, the PCB tray loaded with a PCB is placed onto the transferring unit, the transferring unit delivers the PCB tray to the elevator unit, the elevator unit delivers the PCB tray to the cleaning unit, and after cleaning, the PCB tray is delivered to the unloading deck. In present invention, after placing a PCB in the PCB tray, the whole cleaning process can be completed automatically without any manual participation, and the operating staffs only need to replace cleaning fabric and add alcohol periodically. In this way, the embodiments of present invention can not only save manpower, but also achieve standardization of the cleaning process and improve working efficiency.

BRIEF DESCRIPTION OF THE DRAWINGS

In order to illustrate the technical solution of the embodiment of present invention more clearly, a simply introduction about the drawings of the embodiments will be made in the following, and obviously, the drawings described below relate to only some embodiments of the present invention, rather than are of limitation to the present invention.

REFERENCE NUMERALS

1. PCB tray; 2. transferring unit; 3. elevator unit; 4. cleaning unit; 5. unloading deck; 6. electrical motor; 7. cylinder; 8. cleaning head; 9. alcohol pipe; 10. x-axis, y-axis guide rails; 11. cleaning fabric; 12. alcohol tank; 13. arm; 14. retaining clip; 15. spring clamp; 16. sliding tray.

DETAILED DESCRIPTION

To make clearer the object, technical solutions and advantages of the embodiments of present invention, a clear and full description of the technical solution of the embodiment of present invention will be made with reference to the accompanying drawings of the embodiment of present invention. Obviously, the described embodiments are merely part of the embodiments of the present invention, but not all the embodiments. Based on the described embodiments of present invention, all the other embodiments acquired by the ordinary skilled in this art, without any creative labor, fall into the protective scope of the present invention.

Unless defined otherwise, the technical terms or scientific terminology being used should take the meaning usually understood by the ordinary skilled in this art of present invention. The phrase "a," "an," "the" or the like does not mean quantitative restriction, but refers to the existence of at least one. The phrase such as "comprise," "include," "contain" or the like intend to mean that the elements or articles before it encompass the elements or articles and the equallent thereof listed after the phrase, and do not exclude other elements or articles. The phrase such as "connecting" or "coupling" and the like is not limited to physical or mechanical connection, but may comprise electrical connection regardless of being direct or indirect. Further, the word "on", "under", "left", "right" etc are used only for describing a relative positional relationship, which will be varied correspondingly when the described objects are changed in its absolute position.

The basic concept of present invention is that: a PCB tray loaded with PCBs is placed onto a transferring unit, the transferring unit delivers the PCB tray to an elevator unit, the elevator unit delivers the PCB tray to a cleaning unit, and after cleaning, the PCB tray is delivered to an unloading deck.

Figure 1:
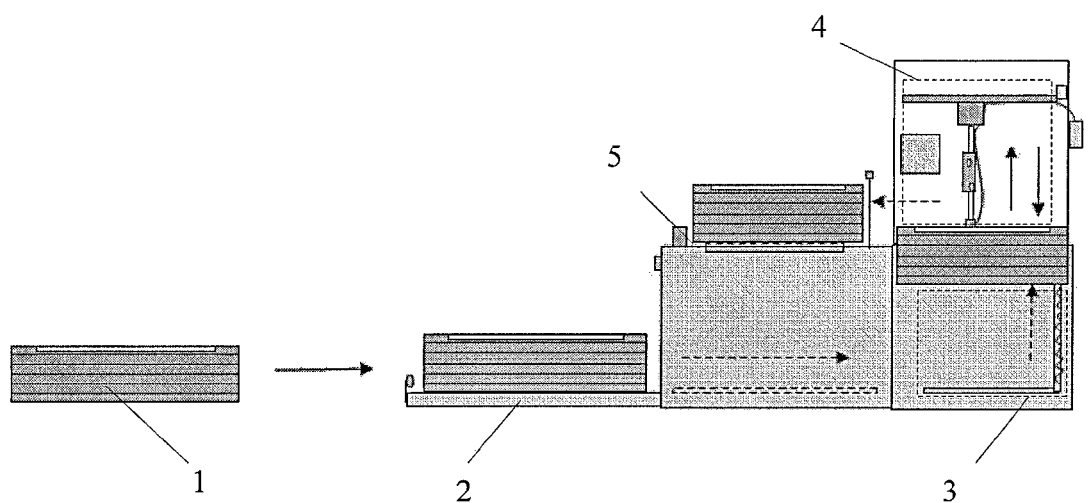
FIG. 1 is a structural illustration view of a device for automatically cleaning printed circuit board according to an embodiment of present invention.

FIG. 1 is a structural illustration view of the device for automatically cleaning printed circuit board of present invention. As shown in FIG. 1, the device for automatically cleaning printed circuit board comprises: a PCB tray 1, a transferring unit 2, an elevator unit 3, a cleaning unit 4 and an unloading deck 5. The transferring unit 2 is adapted to deliver the PCB tray 1 to the elevator unit 3; the elevator unit 3 is adapted to deliver the PCB tray 1 to the cleaning unit 4; the cleaning unit 4 is adapted for cleaning a PCB in the PCB tray 1; and the unloading deck 5 is adapted for carrying on the PCB tray loaded with the cleaned PCB. The transferring unit 2 may be provided as a conveyor belt of a certain width, for example, a width of the conveyor belt is greater than a width of the PCB tray 1. The elevator unit 3 comprises, as shown by the dotted frame in FIG. 1, a horizontal part and a vertical part; the elevator unit 3 may be provided as an elevator, for example, and when the elevator unit 3 is descended to the lowest position, its upper surface of the horizontal part is at the same horizontal position with the upper surface of the transferring unit 2. The elevator unit 3 is located below the cleaning unit 4, and when the elevator unit 3 is lifted to the its top position, the cleaning unit 4 can clean the PCB held in the PCB tray 1 carried on the elevator unit 3. The cleaning unit 4 is shown by the dotted frame in FIG. 1 as well. The unloading deck 5 is located above the transferring unit 2. In practical application process, after cleaning of the PCB, for example, a mechanical hand can be used to place the PCB tray 1 onto the unloading deck 5.

Figure 2:
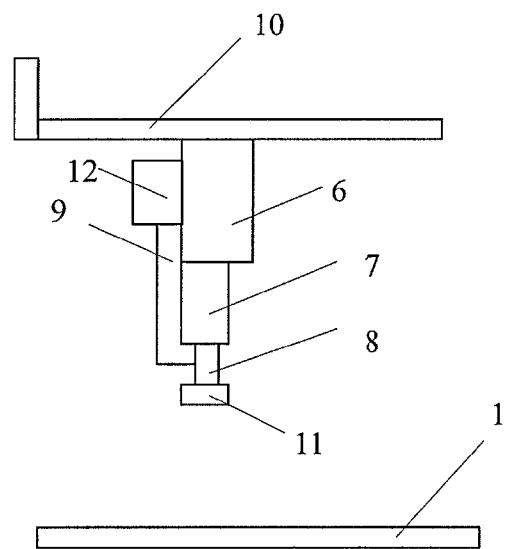
FIG. 2 is a structural illustration view of a cleaning unit in the cleaning device according to the embodiment of present invention.

FIG. 2 is a structural illustration view of the cleaning unit according to the embodiment of present invention. As shown in FIG. 2, the cleaning unit comprises: an electrical motor 6, a cylinder 7, a cleaning head 8, an alcohol pipe 9, as well as x-axis and y-axis guide rails 10. The x-axis direction and y-axis direction are the directions of both orthogonal sides of the PCB in the PCB tray 1. The electrical motor 6 is provided on the x-axis and y-axis guide rails 10 so as to control the movements of the cleaning head 8 in the x-axis and y-axis directions; the upper end of the cylinder 7 is coupled with the lower end of the electrical motor 6 so as to control up-down movement of the cleaning head 8; the cleaning head 8 is arranged at the lower end of the cylinder 7, and the lower end of the cleaning head 8 is further provided with cleaning fabric 11, such as dust-free fabric or the like. In practical application, replacing period for the cleaning fabric may be set as required so as to replace the cleaning fabric periodically, to achieve favorable cleaning effect. The lower end of the alcohol pipe 9 communicates with the cleaning head 8, and the upper end of the alcohol pipe 9 may also provided with a alcohol tank 12; a flow inductive sensor may also be arranged inside the alcohol tank 12 to control the flow of alcohol. The alcohol pipe 9 is an example of the cleaning solution supplying head, while alcohol is an example of cleaning solution; of course the embodiment of present invention is not limited thereto.

Figure 3:
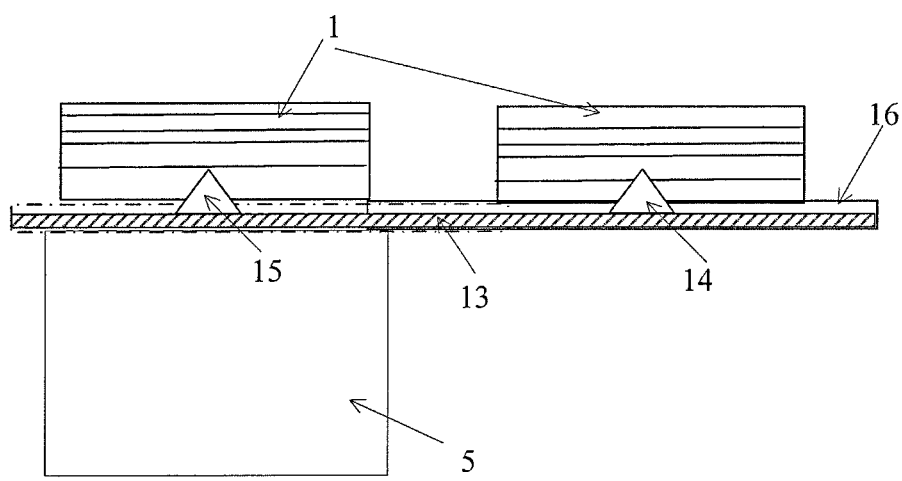
FIG. 3 is a side structural illustration view of a mechanical hand according to the embodiment of present invention.

FIG. 3 is a side structural illustration view of a mechanical hand according to the embodiment of present invention. As shown in FIG. 3, the mechanical hand is provided on the unloading deck 5, comprising: two arms 13 symmetrically arranged on both sides of the upper surface of the unloading deck, two/four retaining clips 14, two/four spring clamps 15, and a sliding tray 16. The two/four retaining clips 14 as well as two/four spring clamps 15 are provided symmetrically on the two arms 13 respectively; the sliding tray 16 may slide on the arms 13 under the control of the cylinder, and is slidably connected with the arms 13.

In use, when the PCB tray 1 loaded with a PCB is delivered to the cleaning unit 4 by the elevator unit 3, the retaining clips 14 retain the PCB tray 1 and the cleaning unit 4 clean the PCB; after the cleaning of the PCB, the sliding tray 16 moves from the dotted position shown in FIG. 3, i.e., from left side, to the underside of and carry on the PCB tray 1, then the retaining clips 14 release; the sliding tray 16 again carries back the PCB tray 1 to the dotted position and places it on the spring clamps 15, and thereby the unloading operation is completed.

The method for using the device according to the embodiment of present invention is as follows. The PCB tray loaded with an PCB is placed on the transferring unit, and the transferring unit delivers the PCB tray to the elevator unit; the elevator unit delivers the PCB tray loaded with the PCB to the cleaning unit; the cleaning head moves vertically and horizontally under the control from the electrical motor and the cylinder, thus completing cleaning of the PCB; after the cleaning, the mechanical hand delivers the PCB tray to the unloading deck.

In the embodiment of present invention, after placing the PCB in the PCB tray, the whole cleaning process can be completed automatically without any manual participation, and operating staffs only need to replace cleaning fabric and add alcohol periodically. In this way, the embodiment of present invention can not only save manpower, but also achieve standardization of the cleaning process and improve working efficiency.

The above described are solely exemplary embodiments of present invention, rather than limitation on the protective scope of present invention which is defined by the attached claims.

The invention claimed is:

1. A device for automatically cleaning printed circuit board, comprising a printed circuit board (PCB) tray, a transferring unit, an elevator unit, a cleaning unit and an unloading deck; wherein
the transferring unit is configured to deliver the PCB tray to the elevator unit;
the elevator unit is configured to deliver the PCB tray to the cleaning unit;
the cleaning unit is configured to clean a PCB in the PCB tray;
the unloading deck is configured to carry on the PCB tray loaded with the cleaned PCB;
the elevator unit comprises a horizontal part and a vertical part;
when the elevator unit is descended to the lowest position, an upper surface of the transferring unit is at a same horizontal position with an upper surface of the horizontal part of the elevator unit; the elevator unit is located below the cleaning unit, and the elevator and the cleaning unit are sequentially arranged along a direction from the lowest position where the elevator is descended to a top position where the elevator is lifted, the cleaning unit can clear the PCB in the PCB tray that is carried on the elevator unit when the elevator unit is lifted to the top position; and the unloading deck is located above the transferring unit.

2. The device for automatically cleaning printed circuit board according to claim 1, wherein the transferring unit is a conveyor belt.

3. The device for automatically cleaning printed circuit board according to claim 2, wherein a width of the conveyor belt is greater than a width of the PCB tray.

4. The device for automatically cleaning printed circuit board according to claim 1, wherein the elevator unit is an electrical lift.

5. The device for automatically cleaning printed circuit board according to claim 1, wherein the cleaning unit comprises a electrical motor, a cylinder, a cleaning head, a cleaning solution supplying head as well as x-axis and y-axis guide rails; wherein
the electrical motor is located on the x-axis and y-axis guide rails, so as to control the movements in the x-axis and y-axis directions; an upper end of the cylinder is coupled with a lower end of the electrical motor, so as to control the up-down movement of the cleaning head; the cleaning head is provided at a lower end of the cylinder; and a lower end of the cleaning solution supplying head communicates with the cleaning head.

6. The device for automatically cleaning printed circuit board according to claim 5, wherein the lower end of the cleaning head is further provided with cleaning fabric.

7. The device for automatically cleaning printed circuit board according to claim 6, wherein the cleaning fabric is dust-free fabric.

8. The device for automatically cleaning printed circuit board according to claim 1, wherein the device further comprises a mechanical hand provided on the unloading deck.

9. The device for automatically cleaning printed circuit board according to claim 8, wherein the mechanical hand comprises: two arms, two/four retaining two/four spring clamps and sliding tray; wherein
the two arms are symmetrically arranged on both sides of an upper surface of the unloading deck, respectively; the two/four retaining clips are symmetrically provided on the two arms respectively, and the two/four spring clamps are symmetrically provided on the two arms respectively; the sliding tray is slidably connected with the arms.

10. The device for automatically cleaning printed circuit board according to claim 2, wherein the elevator unit is an electrical lift.

11. The device for automatically cleaning printed circuit board according to claim 2, wherein the cleaning unit comprises a electrical motor, a cylinder, a cleaning head, a cleaning solution supplying head as well as x-axis and y-axis guide rails; wherein
the electrical motor is located on the x-axis and y-axis guide rails, so as to control the movements in the x-axis and y-axis directions; an upper end of the cylinder is coupled with a lower end of the electrical motor, so as to control the up-down movement of the cleaning head; the cleaning head is provided at a lower end of the cylinder; and a lower end of the cleaning solution supplying head communicates with the cleaning head.

12. The device for automatically cleaning printed circuit board according to claim 11, wherein the lower end of the cleaning head is further provided with cleaning fabric.

13. The device for automatically cleaning printed circuit board according to claim 12, wherein the cleaning fabric is dust-free fabric.

14. The device for automatically cleaning printed circuit board according to claim 2, wherein the device further comprises a mechanical hand provided on the unloading deck.

15. The device for automatically cleaning printed circuit board according to claim 3, wherein the elevator unit is an electrical lift.

16. The device for automatically cleaning printed circuit board according to claim 3, wherein the cleaning unit comprises a electrical motor, a cylinder, a cleaning head, a cleaning solution supplying head as well as x-axis and y-axis guide rails; wherein
the electrical motor is located on the x-axis and y-axis guide rails, so as to control the movements in the x-axis and y-axis directions; an upper end of the cylinder is coupled with a lower end of the electrical motor, so as to control the up-down movement of the cleaning head; the cleaning head is provided at a lower end of the cylinder; and a lower end of the cleaning solution supplying head communicates with the cleaning head.

17. The device for automatically cleaning printed circuit board according to claim 16, wherein the lower end of the cleaning head is further provided with cleaning fabric.

18. The device for automatically cleaning printed circuit board according to claim 17, wherein the cleaning fabric is dust-free fabric.

19. The device for automatically cleaning printed circuit board according to claim 3, wherein the device further comprises a mechanical hand provided on the unloading deck.

* * * * *